United States Patent [19]
Akiyama et al.

[11] Patent Number: 5,439,783
[45] Date of Patent: Aug. 8, 1995

[54] COMPOSITION FOR TREATING COPPER OR COPPER ALLOYS

[75] Inventors: Daisaku Akiyama; Yoshiro Maki, both of Amagasaki, Japan

[73] Assignee: MEC Co., Ltd., Amagasaki, Japan

[21] Appl. No.: 217,638

[22] Filed: Mar. 25, 1994

[30] Foreign Application Priority Data

Apr. 5, 1993 [JP] Japan .................. 5-100121

[51] Int. Cl.$^6$ ............................. G03C 11/06
[52] U.S. Cl. .................... 430/331; 252/79.1; 252/79.4; 252/150; 252/173; 134/3; 134/41; 216/106
[58] Field of Search .............. 430/331; 252/79.1, 79.4, 252/148, 150, 173, 542, DIG. 14; 134/3, 41; 156/666

[56] References Cited

U.S. PATENT DOCUMENTS

| | | | |
|---|---|---|---|
| 3,770,530 | 11/1973 | Fujimoto | 156/3 |
| 3,773,577 | 11/1973 | Shibasaki et al. | 156/8 |
| 3,948,703 | 4/1976 | Kushibe | 156/20 |
| 4,264,418 | 4/1981 | Wood et al. | 204/129.95 |
| 4,622,097 | 11/1986 | Tsukagoshi et al. | 156/644 |
| 5,219,484 | 6/1993 | Krulik | 252/79.2 |

FOREIGN PATENT DOCUMENTS 2134333 12/1972 France .
09829 12/1988 WIPO ................... 156/666

OTHER PUBLICATIONS

Database WPI, Derwent Publications Ltd., AN 85-027934, JP-A-59 222584, Dec. 14, 1984.
Chemical Abstracts, vol. 113, No. 10, Sep. 3, 1990, AN 83398m, p. 311, IN 164,271 Feb. 11, 1989.

Primary Examiner—Hoa Van Le
Attorney, Agent, or Firm—Oblon, Spivak, McClelland, Maier, & Neustadt

[57] ABSTRACT

A composition suitable for the treatment of surfaces of copper and copper alloys is disclosed. It comprises, (a) a cupric complex of an azole compound, (b) an organic acid having a boiling point or a decomposition point of 230° C or lower, (c) a difficultly volatile complexing agent, (d) a complexing agent having a complexing power which is weaker than that of the azole compound, and (e) water. The treatment of copper or copper alloys with the composition produces abraded surface with moderate irregularities, thereby ensuring better adhesion of various resists thereto and increased solderability. The composition is particularly useful for the manufacture of printed-wiring boards.

7 Claims, No Drawings

1

COMPOSITION FOR TREATING COPPER OR COPPER ALLOYS

BACKGROUND OF THE INVENTION

1. Field of the Invention

The present invention relates to a composition for the treatment of surfaces of copper or copper alloys which is useful in removing rust and in roughening the surfaces of these materials.

2. Description of the Background Art

A treatment called microetching which consists of chemically abrading copper surfaces is performed in the manufacture of printed-wiring boards for promoting adhesion of etching resists and solder resists and for improving the soldering performances when electronic components are fixed to the wiring boards. The microetching consists of chemically abrading the surfaces of copper using an aqueous solution comprising sulfuric acid and hydrogen peroxide or an aqueous solution comprising a persulfate, as major components.

The treatment using an etching agent comprising sulfuric acid and hydrogen peroxide or a persulfate, as major components, however, may cause corrosion of the wiring circuit and, in the worst case, may break the circuit, if the components in the etching agent remain in the substrate due to insufficient washing. These conventional etching agents produce mists during the treatment operation, which may pollute the working environment.

Therefore, there has been a desire for the development of a composition for the treatment of surfaces of copper and copper alloys, which does not cause corrosion of the circuit, does not involve a risk of the circuit breakage, and does not accompany the production of mists and noxious gases, thereby improving the circumstances where the printed-wiring boards are manufactured.

As a result of extensive studies, the present inventors have found that a combination a cupric complex of azole compound, specific organic acid, and specific complexing compounds can provide a surface treating agent which satisfies these requirements.

SUMMARY OF THE INVENTION

Accordingly, an object of the present invention is to provide a composition for the treatment of surfaces of copper and copper alloys which comprises, (a) a cupric complex of azole compound, (b) an organic acid having a boiling point or a decomposition point of 230° C. or lower, a difficultly volatile complexing agent, (c) a complexing agent having a complexing power which is weaker than the complexing power of the azole compound, and (d) water.

These and other objects, features, and advantages of the present invention will become more apparent from the following description of the preferred embodiments taken in conjunction with the accompanying drawings.

DETAILED DESCRIPTION OF THE INVENTION AND PREFERRED EMBODIMENTS

The cupric complex of azole compound, which is component (a) of the composition of the present invention, acts as an oxidizing agent which oxidizes metallic copper or the like. Among various cupric complexes which possess oxidizing effects, the cupric complexes of an azole compound are effective for the surface treating composition of the present invention to exhibit a suitable etching rate. Diazole compounds, triazole compounds, tetrazole compounds, and derivatives of these are included in the azole compounds which can be used for forming the cupric complex in the present invention. Among these, preferred in view of costs, availability, and the like are imidazole, 2-methylimidazole, 2-ethyl-4-methylimidazole, 2-phenylimidazole, 2-undecylimidazole, and benzimidazole.

These cupric complexes of azole compound may be used either singly or in combination as component (a) in the composition of the present invention.

The amount of component (a) incorporated in the composition of the present invention can be suitably determined taking the aimed oxidizing effect and other factors into consideration, typically from the range of 1–5% by weight. If this amount is less than 1% by weight, the oxidizing power is too small for the composition to exhibit a sufficient etching effect.

In the preparation of the composition of the present invention, either the cupric complex of azole compound can be used as component (a) or a copper (II) source and an azole compound may be separately added to form a cupric complex in the composition. As the source of copper (II), copper (II) hydroxide or copper (II) salts of an organic acid which is described below are preferred.

The organic acid having a boiling point or a decomposition point of 230° C. or lower, which is the component (b), is added to the composition of the present invention in order to dissolve the copper which is oxidized by the cupric complex of azole compound. When electronic components are fixed to printed-wiring boards by soldering, typically at temperatures of 200°–260° C., it must be removed by volatilization or decomposition, so as not to affect the reliability of the product. Specific examples of the organic acid include saturated aliphatic acids, such as formic acid, acetic acid, propionic acid, butyric acid, valeric acid, and caproic acid; unsaturated aliphatic acid, such as acrylic acid, crotonic acid, and isocrotonic acid; saturated aliphatic dicarboxylic acids, such as oxalic acid, malonic acid, succinic acid, glutaric acid, adipic acid, and pimelic acid; unsaturated aliphatic dicarboxylic acids, such as maleic acid; and aromatic dicarboxylic acids, such as benzoic acid and phthalic acid.

These organic acids may be used either singly or in combination as component (b) in the composition of the present invention.

The component (b) may be incorporated in the composition of the present invention in an amount of about 5–30% by weight. If the amount is too small, the composition cannot sufficiently dissolve copper, producing only unacceptable surface conditions of the copper or copper alloy. If the amount of the organic acid is too large, the copper dissolving stability is impaired.

The difficultly volatile complexing agent, component (c) of the present invention, is defined as a complexing agent which can volatilize only with difficulty. It plays a role of stably maintaining the copper which has been dissolved by the organic acid and has an advantage of not polluting the working environments. Specific examples of the difficultly volatile complexing agent include aliphatic amines, such as butyl amine, amyl amine, hexyl amine, dipropyl amine, diisopropyl amine, dibutyl amine, triethyl amine, and tripropyl amine; aromatic amines such as aniline; alkanol amines, such as monoethanolamine, diethanolamine, triethanolamine, and isopropanolamine; and amino acids, such as glycine, alanine, arginine, and asparagine. Among these, alkanol amines are particularly preferred, because they have an effect of increasing solderability when the printed-wiring boards treated with the composition of the present invention are soldered.

These complexing agents may be used either singly or in combination as component (c) in the composition of the present invention. The amount of component (c) to be incorporated in the composition of the present invention is preferably 1% by weight or more, and usually less than 20% by weight. Because the difficultly volatile complexing agent is consumed as copper or the like is dissolved in the course of the surface treatment using the composition of the present invention, it must be appropriately supplied such that the above prescribed amount is always contained in order to achieve a stable surface treatment operation.

For ensuring stable dissolution of copper, the difficultly volatile complexing agent used in the present invention should have a complexing power stronger than that of the azole compounds. With the use of this difficultly volatile complex alone, however, a sufficient etching rate cannot be achieved due to decrease in oxidizing power of the azole complex compound. Because of this and in order to achieve a desired etching rate, another complexing agent which has a complexing power weaker than that of the azole compound is incorporated to the composition of the present invention, as component (d). The types of the complexing agent used as the component (d) depend on the types of the azole compound used. Some examples are ammonia, pyridine, acetylhistidine, xantone, 2-(2-ethyl)pyridine, and the like.

These complexing agents may be used as component (d) either singly or in combination in the composition of the present invention.

The amount of component (d) cannot be generically specified, because it may be varied depending of the types of other components and the cost of the complexing agent. Such an amount is typically 0.5-10% by weight in the composition of the present invention.

These components (a) to (d) are dissolved in water, component (e), to prepare the composition of the present invention. Water purified by distillation or ion-exchanged water is used as component (e).

It is desirable that the composition has a pH in a range of 6-8, measured at 40° C. If the composition has a pH outside this range, sodium hydroxide, ammonia, or an organic acid may be further added so as to adjust the pH within this range. The above-mentioned organic acids used as component (b) can be preferably used as the acid for this purpose. In this instance, the amount of ammonia or the organic acid added should not exceed the amounts prescribed for preparing the composition of the present invention. If the pH is smaller than 6, the oxidation does not take place smoothly, retarding the rate of etching; if it is greater than 8, the rate of oxidation is too high so that the surface conditions of the products may be impaired.

Other additives conventionally known in the art may be added to the composition of the present invention so long as the effects of the present invention are not adversely affected.

The composition of the present invention may be applied to the surface of the copper or copper alloy for the treatment of the surface by using a method such as spraying or soaking. When the soaking method is employed, air is preferably bubbled into the composition in order to oxidize copper (I) produced by etching into cooper (II).

The composition for surface treatment of the present invention can be widely applied to the chemical abrasion or the like of copper or copper alloys. Because the abraded surface is provided with moderate irregularities, the adhesion of various resists thereto is increased and solderability is also improved. The composition is particularly useful for the manufacture of printed-wiring boards.

Other features of the invention will become apparent in the course of the following description of the exemplary embodiments which are given for illustration of the invention and are not intended to be limiting thereof.

EXAMPLES

Example 1-4

Compositions 1-4 were prepared by mixing components shown in Table 1 and adjusting the pH to 6.5.

Substrates for printed-wiring boards with both side laminated with copper-clad (FR-4), each having a size of 150 mm×70 mm×1.6 mm, and 1000 throughholes, were used for the test. One side of the substrates was covered with a solder resist and the substrates were soaked in the compositions at 25° C. for 1 minute. The odor produced by the soaking and the conditions of the surface not covered with the solder resist after the substrate was removed from the composition were examined. The etching amount was measured. The results are given in Table 1. The substrates were then heated at 230° C. for 3 minutes without washing with water. After allowing to stand the substrates in a thermostat at 80° C. and 90% RH for 30 days, the rate of conductivity break through throughholes was determined by measuring the resistance in the throughholes, The conductivity was deemed to have been broken, if the resistance of the throughhole exceeded 1 ohm, and the percentage of such throughholes were taken as a measure of the rate of conductivity breakage. The results are shown in Table 1.

Comparative Examples 1-3

Comparative Compositions 1-3 were prepared by mixing components shown in Table 2. The same tests as in Examples 1-4 were carried out in order to evaluate the performances of these comparative compositions. The results are shown in Table 2.

TABLE 1

| Example | Component (wt %) | Conductivity breakage (%) | Finished conditions | Odor | Etching amount (μm) |
| --- | --- | --- | --- | --- | --- |
| 1 | 2-Methylimidazole.copper (II) complex (3)<br>Acetic acid (5)<br>Aniline (3)<br>Pyridine (1)<br>Ion-exchanged water (88) | 0 | There were irregularities suitable for lamination and soldering | Slight acetic acid odor, but with no problem | 0.28 |
| 2 | 2-Methylimidazole.copper (II) complex (3) | 0 | There were irregularities | No odor | 0.42 |

TABLE 1-continued

| Example | Component (wt %) | Conductivity breakage (%) | Finished conditions | Odor | Etching amount (μm) |
|---|---|---|---|---|---|
| | Oxalic acid (5) Aniline (3) Pyridine (1) Ion-exchanged water (88) | | suitable for lamination and soldering | | |
| 3 | 2-Methylimidazole.copper (II) complex (3) Acetic acid (5) Diethanolamine (3) Pyridine (1) Ion-exchanged water (88) | 0 | There were irregularities suitable for lamination and soldering | Slight acetic acid odor, but with no problem | 0.33 |
| 4 | Imidazole.copper (II) complex (3) Acetic acid (5) Aniline (3) Pyridine (1) Ion-exchanged water (88) | 0 | There were irregularities suitable for lamination and soldering | Slight acetic acid odor, but with no problem | 0.56 |

TABLE 2

| Comparative Example | Component (wt %) | Conductivity breakage (%) | Finished conditions | Odor | Etching amount (μm) |
|---|---|---|---|---|---|
| 1 | Sulfuric acid (10) Hydrogen peroxide (5) Ion-exchanged water (85) | 32.4 | There were irregularities suitable for lamination and soldering | Irritative odor | 0.82 |
| 2 | Sodium persulfate (10) Sulfuric acid (1) Ion-exchanged water (89) | 21.4 | There were irregularities suitable for lamination and soldering | Irritative odor | 0.63 |
| 3 | Sulfuric acid (10) Ion-exchanged water (90) | 29.7 | No effects other than rust prevention. The surfaces remained smooth. | No odor | 0.011 |

Obviously, numerous modifications and variations of the present invention are possible in light of the above teachings. It is therefore to be understood that within the scope of the appended claims, the invention may be practiced otherwise than as specifically described herein.

Japanese Patent Application No. 100121/1993 filed on Apr. 5, 1993 is hereby incorporated by reference.

What is claimed is:

1. A composition for the treatment of surfaces of copper and copper alloys which comprises, (a) a cupric complex of an azole compound, (b) an organic acid having a boiling point or a decomposition point of 230° C. or lower, (c) a difficultly volatile complexing agent, (d) a complexing agent having a complexing power which is weaker than the complexing power of the azole compound, and (e) water.

2. The composition according to claim 1, wherein the azole compound forming said cupric complex is selected from the group consisting of imidazole, 2-methylimidazole, 2-ethyl-4-methylimidazole, 2-phenylimidazole, 2-undecylimidazole, and benzimidazole.

3. The composition according to claim 1, wherein said organic acid having a boiling point or a decomposition point of 230° C. or lower is selected from the group consisting of formic acid, acetic acid, propionic acid, butyric acid, valeric acid, caproic acid, acrylic acid, crotonic acid, isocrotonic acid, oxalic acid, malonic acid, succinic acid, glutaric acid, adipic acid, pimelic acid, maleic acid, benzoic acid, and phthalic acid.

4. The composition according to claim 1, wherein said difficultly volatile complexing agent is selected from the group consisting of butyl amine, amyl amine, hexyl amine, dipropyl amine, diisopropyl amine, dibutyl amine, triethyl amine, tripropyl amine, aniline, monoethanolamine, diethanolamine, triethanolamine, isopropanolamine, glycine, alanine, arginine, and asparagine.

5. The composition according to claim 1, wherein said complexing agent which has a complexing power weaker than the complexing power of the azole compound is selected from the group consisting of ammonia, pyridine, acetylhistidine, xantone, and 2-(2-ethyl)-pyridine.

6. The composition according to claim 1, having a pH of 6 to 8.

7. A composition for the treatment of surfaces of copper and copper alloys which comprises, (a) 1–5% by weight of a cupric complex of an azole compound, (b) 5–30% by weight of an organic acid having a boiling point or a decomposition point of 230° C. or lower, (c) 1–20% by weight of a difficultly volatile complexing agent, (d) 0.5–10% by weight of a complexing agent having a complexing power which is weaker than the complexing power of the azole compound, and (e) water.

* * * * *